US009266153B2

(12) United States Patent
Nagamine et al.

(10) Patent No.: US 9,266,153 B2
(45) Date of Patent: Feb. 23, 2016

(54) SUBSTRATE PROCESSING APPARATUS AND SUBSTRATE PROCESSING METHOD

(71) Applicant: TOKYO ELECTRON LIMITED, Tokyo (JP)

(72) Inventors: Shuichi Nagamine, Koshi (JP); Yusuke Hashimoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 14/233,496

(22) PCT Filed: Oct. 16, 2012

(86) PCT No.: PCT/JP2012/076734
§ 371 (c)(1),
(2) Date: Jan. 17, 2014

(87) PCT Pub. No.: WO2013/061831
PCT Pub. Date: May 2, 2013

(65) Prior Publication Data
US 2014/0290701 A1  Oct. 2, 2014

(30) Foreign Application Priority Data
Oct. 24, 2011 (JP) .................... 2011-233159

(51) Int. Cl.
*B08B 3/00* (2006.01)
*B08B 3/04* (2006.01)
(Continued)

(52) U.S. Cl.
CPC ............ *B08B 3/04* (2013.01); *H01L 21/67028* (2013.01); *H01L 21/67051* (2013.01);
(Continued)

(58) Field of Classification Search
CPC .............. H01L 21/67051; H01L 21/67034; H01L 21/67028; H01L 21/6708; B08B 3/04
USPC ............ 134/157, 26, 902, 33, 94.1, 34, 99.1, 134/104.2, 32, 137, 153, 42; 118/52, 319, 118/56, 326
See application file for complete search history.

(56) References Cited

U.S. PATENT DOCUMENTS 5,868,865 A * 2/1999 Akimoto .................... 134/33
2010/0031980 A1* 2/2010 Ito et al. .................. 134/104.2

FOREIGN PATENT DOCUMENTS

JP  H02-252238 A  10/1990
JP  04-357836 A1  12/1992
(Continued)

OTHER PUBLICATIONS

Higuchi, Koichi, "Treating Device for Substrate", Jan. 2010, JP 2010-010555 (Machine Translation).*
(Continued)

Primary Examiner — Michael Barr
Assistant Examiner — Thomas Bucci
(74) Attorney, Agent, or Firm — Burr & Brown, PLLC

(57) ABSTRACT

A substrate processing apparatus includes: a storage tank configured to store a liquid; a substrate support unit configured to rotatably, horizontally support a substrate; and a plate driving unit configured to move the substrate support unit between an immersion position at which the substrate is immersed into the liquid stored in the storage tank, and a separation position located above the immersion position, at which the substrate is separated from the liquid stored in the storage tank. The substrate processing apparatus also includes a rotary drive unit configured to rotate the substrate supported by the substrate support unit, and liquid supply units configured to supply a liquid to the substrate that is being rotated by the rotary drive unit in the separation position.

6 Claims, 9 Drawing Sheets

(51) Int. Cl.
*H01L 21/67* (2006.01)
*H01L 21/677* (2006.01)
*H01L 21/687* (2006.01)
*H01L 21/311* (2006.01)

(52) U.S. Cl.
CPC .... *H01L21/67057* (2013.01); *H01L 21/67109* (2013.01); *H01L 21/67748* (2013.01); *H01L 21/68792* (2013.01); *H01L 21/31133* (2013.01)

(56) References Cited

FOREIGN PATENT DOCUMENTS

| | | |
|---|---|---|
| JP | 2002-075943 A1 | 3/2002 |
| JP | 2005-142290 A | 6/2005 |
| JP | 2006-073753 A | 3/2006 |
| JP | 2007-035866 A1 | 2/2007 |
| JP | 2008-227386 A1 | 9/2008 |
| JP | 2010-010555 A1 | 1/2010 |
| JP | 2010010555 A * | 1/2010 |
| JP | 2011-103361 A1 | 5/2011 |
| JP | 2011103361 A * | 5/2011 |

OTHER PUBLICATIONS

Kubo, Kazuki, "Lift-Off Apparatus and Lift-Off Processing Method", May 2011, JP 2011-103361 (Machine Translation).*
International Search Report dated Jan. 8, 2013.

* cited by examiner (a)

(b)

SUBSTRATE PROCESSING APPARATUS AND SUBSTRATE PROCESSING METHOD

FIELD OF THE INVENTION

The present invention relates to a substrate processing apparatus and a substrate processing method, configured to liquid-process substrates, such as semiconductor wafers and glass substrates for flat panel displays.

In a step for manufacturing a semiconductor wafer and a glass substrate for flat panel displays, a liquid process using a liquid is sometimes performed to a substrate for processing the substrate.

BACKGROUND ART

In a step for manufacturing a semiconductor wafer and a glass substrate for flat panel display, a liquid process using a liquid is sometimes performed to a substrate for processing the substrate.

A substrate is sometimes processed in the following manner (JP2007-35866A). Namely, a substrate is supported with a front surface (patterned surface) of the substrate facing upward, and a process liquid is supplied to the front surface. The process liquid flowing down from the substrate is received in a process-liquid storage tray. The process liquid is stored in the process-liquid storage tray at a height where a rear surface of the substrate is in contact with the process liquid or more. Then, the substrate is liquid-processed with the process liquid.

In addition, a substrate is sometimes liquid-processed in the following manner (JP2002-75943A). Namely, a process liquid is supplied to a space between an opposed member, which is disposed opposite to a lower surface of a substrate, and the lower surface of the substrate to form a liquid layer, and the substrate is liquid-processed by giving ultrasonic vibrations to the substrate through the liquid layer.

In a step of liquid-processing a substrate, a surface of the substrate is sometimes cleaned by a process liquid, rinsed, and then dried.

In the substrate processing apparatus of JP2007-35866A, a surface of a substrate can be cleaned by a cleaning liquid as a process liquid. However, when the surface is rinsed after the cleaning process, a step of replacing the cleaning liquid with a rinse liquid is needed. Further, in order to dry the surface, a step of draining the supplied rinse liquid is needed. As to the substrate processing apparatus of JP2002-75943A, although a substrate can be unloaded therefrom, and the substrate is rinsed by another substrate processing apparatus, it may take time for unloading the substrate. Such an increase in number of steps and processing time raises a manufacturing cost. Thus, in order to decrease the number of steps (processing time) starting from a substrate liquid process to a cleaning and drying process, there is desired a single processing unit capable of performing both a process in which a substrate is immersed into a liquid layer (process by DIP) and a liquid-membrane process in which a liquid is supplied to a rotating substrate and is then spun off.

SUMMARY OF THE INVENTION

The present invention has been made in view of the above circumstances. The present invention provides a substrate processing apparatus and a substrate processing method, by which a single processing unit can clean a substrate by immersing the substrate into a liquid layer and can process the substrate with a liquid membrane by the rotation of the substrate.

A substrate processing apparatus according to the present invention comprises:
a storage tank configured to store a liquid;
a substrate support unit configured to rotatably, horizontally support a substrate;
a plate driving unit configured to move the substrate support unit between an immersion position at which the substrate is immersed into the liquid stored in the storage tank, and a separation position located above the immersion position, at which the substrate is separated from the liquid stored in the storage tank;
a rotary drive unit configured to rotate the substrate supported by the substrate support unit;
a liquid supply unit configured to supply a liquid to the substrate that is being rotated by the rotary drive unit in the separation position; and
a cup unit disposed on an outer peripheral side of the storage tank to surround the substrate that is supported by the substrate support unit in the separation position.

In the substrate processing apparatus according to the present invention,
the storage tank may have a storage-member bottom unit disposed opposite to a lower surface of the substrate supported by the substrate support unit, and a storage-member floodgate unit surrounding the storage-member bottom unit; and
the storage-member bottom unit and the storage-member floodgate unit may be relatively movable in an up and down direction.

In the substrate processing apparatus according to the present invention,
the liquid supply unit may include a base plate nozzle that is disposed on the storage-member bottom unit and is configured to supply a liquid to the storage tank or the substrate.

The substrate processing apparatus according to the present invention may further comprise an ultrasonic vibration plate that is disposed on the storage-member bottom unit and is configured to give vibrations to the substrate immersed in the liquid stored in the storage tank.

In the substrate processing apparatus according to the present invention,
the cup unit may have a first liquid accommodation unit, a second liquid accommodation unit disposed on an outer peripheral side of the first liquid accommodation unit, and a movable partition guide partitioning the first liquid accommodation unit and the second liquid accommodation unit; and
when the partition guide is located in an upper guide position, the liquid may be drained through the first liquid accommodation unit, and when the partition guide is located in a lower guide position, the liquid may be drained through the second liquid accommodation unit.

In the substrate processing apparatus according to the present invention,
the substrate support unit may have an annular-shaped top plate member disposed above the substrate that is supported by the substrate support unit.

The substrate processing apparatus according to the present invention may further comprise a heating unit that is disposed on the substrate support unit and is configured to heat the substrate or the liquid on the substrate.

A substrate processing method according to the present invention comprises:
a supporting substrate step in which a substrate is horizontally supported by a substrate support unit;

a rotating step in which the substrate is rotated by the rotation of the substrate support unit;

a liquid membrane formation step in which a first liquid is supplied to the substrate being rotated to form a liquid membrane on the substrate being rotated;

a storing step in which a second liquid is stored in a storage tank;

an immersing step in which the substrate is immersed into the second liquid by the movement of the substrate support unit supporting the substrate; and a separating step in which the substrate is separated from the second liquid by the movement of the substrate support unit supporting the substrate.

In the substrate processing method according to the present invention, during the liquid membrane formation step, it is allowed to accommodate the first liquid spun off from the substrate being rotated in a first liquid accommodation unit surrounding the storage tank; and during the immersing step, it is allowed to accommodate the second liquid overflown from the storage tank in a second liquid accommodation unit disposed on an outer peripheral side of the first liquid accommodation unit.

In the substrate processing method according to the present invention, it is allowed to accommodate the first liquid into the first liquid accommodation unit, by locating a movable partition guide partitioning the first liquid accommodation unit and the second liquid accommodation unit in an upper guide position; and it is allowed to accommodate the second liquid into the second liquid accommodation unit, by locating the partition guide in a lower guide position.

In the substrate processing method according to the present invention, the storage tank may have a storage-member bottom unit disposed opposite to a lower surface of the substrate supported by the substrate support unit, and a storage-member floodgate unit disposed to surround the storage-member bottom unit, the substrate processing method may further comprise a step of draining the second liquid by making an upper end position of the storage-member bottom unit higher than an upper end position of the storage-member floodgate unit, while the substrate is separated from the second liquid.

In the substrate processing method according to the present invention, during the immersing step, vibrations may be given to the substrate through the second liquid by an ultrasonic vibration plate disposed on the storage tank.

The substrate processing method according to the present invention may further comprise a drying step in which the substrate is dried by supplying an inert gas through a gap between the substrate support unit and the substrate, and through a gap between the substrate and the storage-member bottom unit.

According to the present invention, there is provided a substrate processing apparatus and a substrate processing method, by which a single processing unit can clean a substrate by immersing the substrate into a liquid layer and can process the substrate with a liquid membrane by the rotation of the substrate.

DETAILED DESCRIPTION OF THE INVENTION

Figure 1:
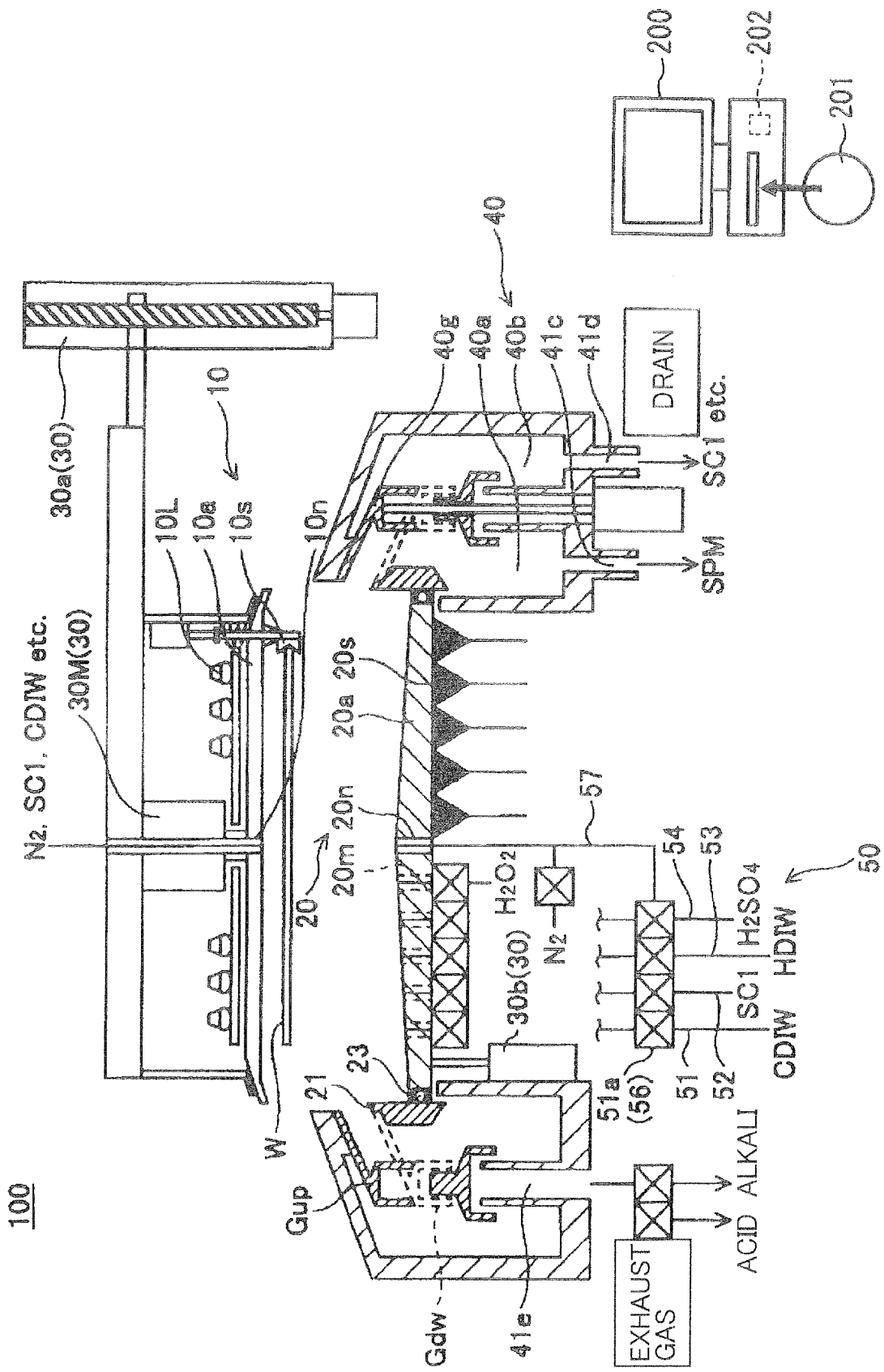
FIG. 1 is a schematic sectional view showing a substrate processing apparatus in an embodiment of the present invention.

A non-limitative exemplary embodiment of the present invention will be described herebelow, with reference to the accompanying drawings. In all the accompanying drawings, the same or corresponding members or components are provided with the same or corresponding reference symbol, and overlapping description is omitted. In addition, the drawings do not intend to show a relative ratio between members or components. Thus, concrete dimensions should be determined by those skilled in the art, in light of the below non-limitative embodiment.

(Structure of Substrate Processing Apparatus)

At first, a substrate processing apparatus in an embodiment of the present invention is described with reference to FIG. 1. In this embodiment, a semiconductor wafer (hereinafter referred to as "wafer") is used as a substrate to be processed.

As illustrated, a substrate processing apparatus 100 includes: a substrate support unit 10 configured to support a wafer W; a storage-member bottom unit 20 disposed opposite to a lower surface of the supported wafer W; a storage-member floodgate unit 21 disposed on an outer peripheral side of the storage-member bottom unit 20 to surround the storage-member bottom unit 20; and a driving unit 30 configured to adjust a separation distance between the substrate support unit 10 and the storage-member bottom unit 20. In addition, the substrate processing apparatus 100 is provided with a cup unit 40 that surrounds a circumference of the storage-member floodgate unit 20 so as to collect a liquid supplied to a wafer W and discharge the liquid through a drain opening 41c and so on.

The substrate support unit 10 has an annular-shaped top plate member 10a including a top plate nozzle 10n, a claw unit 10s configured to clamp a wafer W below the top plate member 10a, and a heating unit 10L configured to heat a liquid (process liquid, etc.). The substrate support unit 10 supports a wafer W, with a front surface (patterned surface) of the wafer W facing downward.

The top plate member 10a is located in a position opposed to an upper surface of the wafer W. The top plate nozzle 10n is disposed on a center of the top plate member 10a, and is configured to supply a liquid onto the upper surface of the wafer W. The claw unit 10s may be provided with three claw units at equal intervals therebetween. The heating unit 10L, is configured to heat the wafer W or a liquid to a predetermined temperature, in order that a temperature of the liquid on the surface of the wafer W is uniformly maintained. The heating unit 10L may use an LED, for example.

The storage-member bottom unit 20 has an annular-shaped base plate member 20a including a base plate nozzle 20n and a plurality of ejection openings 20m (FIG. 4(b)), and an ultrasonic vibration plate 20s (FIG. 4(b)) described below. The base plate nozzle 20n is disposed on a center of the base plate member 20a. The plurality of ejection openings 20m are arranged from a central portion of the base plate member 20a toward a peripheral portion thereof. The base plate nozzle 20n and the ejection openings 20m are configured to supply a liquid onto a lower surface of the wafer W. In this embodiment, the top plate nozzle 10n, the base plate nozzle 20n and the ejection openings 20m constitute a liquid supply unit for supplying a liquid onto a wafer W.

The storage-member floodgate unit 21 is a cylindrical member disposed to surround an outer peripheral side of the base plate member 20a. The storage-member floodgate unit 21 can be moved such that a relative positional relationship with respect to the base plate member 20a is varied. When an upper end position of the storage-member floodgate unit 21 is located higher than an upper end of the base plate member 20a, a storage tank capable of storing a liquid is formed by the base plate member 20a and the storage-member floodgate unit 21. At this time, in order that a liquid stored in the storage tank is prevented from leaking out from a gap between the base plate member 20a and the storage-member floodgate unit 21, a sealing member 23 such as an O-ring is provided on a sliding part between the base plate member 20a and the storage-member floodgate unit 21. A method of changing the relative positional relationship between the base plate member 20a and the storage-member floodgate unit 21 may be either a method of moving one of the base plate member 20a and the storage-member floodgate unit 21 or a method of relatively moving both the base plate member 20a and the storage-member floodgate unit 21.

The driving unit 30 includes a motor (rotary drive unit) 30M configured to rotatably support the top plate member 10a of the substrate support unit 10, a plate driving unit 30a configured to vary a separation distance between the substrate support unit 10 (top plate member 10a) and the storage-member bottom unit 20, and a base-plate driving unit 30b configured to move the base plate member 20a upward and downward. The motor 30M can rotate the top plate member 10a and a wafer W supported by the top plate member 10a. The plate driving unit 30a can decrease the separation distance between the substrate support unit 10 and the storage-member bottom unit 20. At this time, the wafer W supported by the substrate support unit 10 (top plate member 10a) is immersed into a liquid (cleaning liquid or the like) stored in the storage tank. The base-plate driving unit 30b can vary a relative positional relationship between an upper end surface of the base plate member 20a and an upper surface of the storage-member floodgate unit 21. By relatively varying the positions of the base plate member 20a and the storage-member floodgate unit 21, the storage tank capable of storing a liquid can be formed, and the liquid stored in the storage tank can be drained.

The cup unit 40 includes an annular first liquid accommodation unit 40a configured to accommodate a liquid that is spun off by the centrifugal force out of a liquid having been supplied to a rotating wafer W, an annular second liquid accommodation unit 40b which is disposed on an outer peripheral side of the first liquid accommodation unit 40a and is configured to accommodate and drain a liquid that is spun off by the centrifugal force out of a liquid having been supplied to a rotating wafer W and a liquid stored in the storage tank, and a movable partition guide 40g which partitions the first liquid accommodation unit 40a and the second liquid accommodation unit 40b. In addition, the cup unit 40 includes a drain opening 41c through which a liquid flowing into the first liquid accommodation unit 40a is drained, a drain opening 41d through which a liquid flowing into the second liquid accommodation unit 40b is drained, and an exhaust opening 41e through which an atmospheric gas in the substrate processing apparatus 100 is discharged. The partition guide 40g located in an upper guide position Gup (position shown by the solid line in FIG. 1) allows a liquid to be drained through the drain opening 41c. The partition wall 40g located in a lower guide position Gdw (position shown by the broken lines in FIG. 1) allows a liquid to be drained through the drain opening 41d.

A liquid supply system of the substrate processing apparatus 100 connects a liquid supply source 50 to the base plate nozzle 20n. In this embodiment, the liquid supply source 50 has four pipes 51 to 54. Liquids (process liquids) to be supplied by the liquid supply source 50 are as follows. SC1 is supplied as a cleaning liquid from the pipe 52. Cold deionized water (CDIW) is supplied as a rinse liquid from the pipe 51. Hot deionized water (HDIW) is supplied as a rinse liquid from the pipe 53. Sulfuric acid ($H_2SO_4$) is supplied as a resist peeling liquid from the pipe 54. A collective valve 56 is disposed for the pipes 51 to 54. An inlet of the collective valve 56 is connected to the pipes 51 to 54, and an outlet of the collective valve 56 is connected to a supply pipe 57. The collective valve 56 is provided with three-way valves correspondingly to the pipes 51 to 54.

The three-way valves are configured to selectively open or close the valves so as to supply a desired liquid to the supply pipe 57. To be specific, when the three-way valve 51a is opened, deionized water (CDIW) flowing through the pipe 51 flows into the supply pipe 57. On the other hand, since the other three-way valves are closed, liquids flowing through the corresponding pipes 52 to 54 flow through the pipes 52 to 54 and do not flow into the supply pipe 57.

Alternatively, in place of the collective valve 56 having such a structure, a plurality of individual valves may be provided on the pipes 51 to 54 to form a structure for selectively supplying a liquid to the supply pipe 57.

Figure 9:
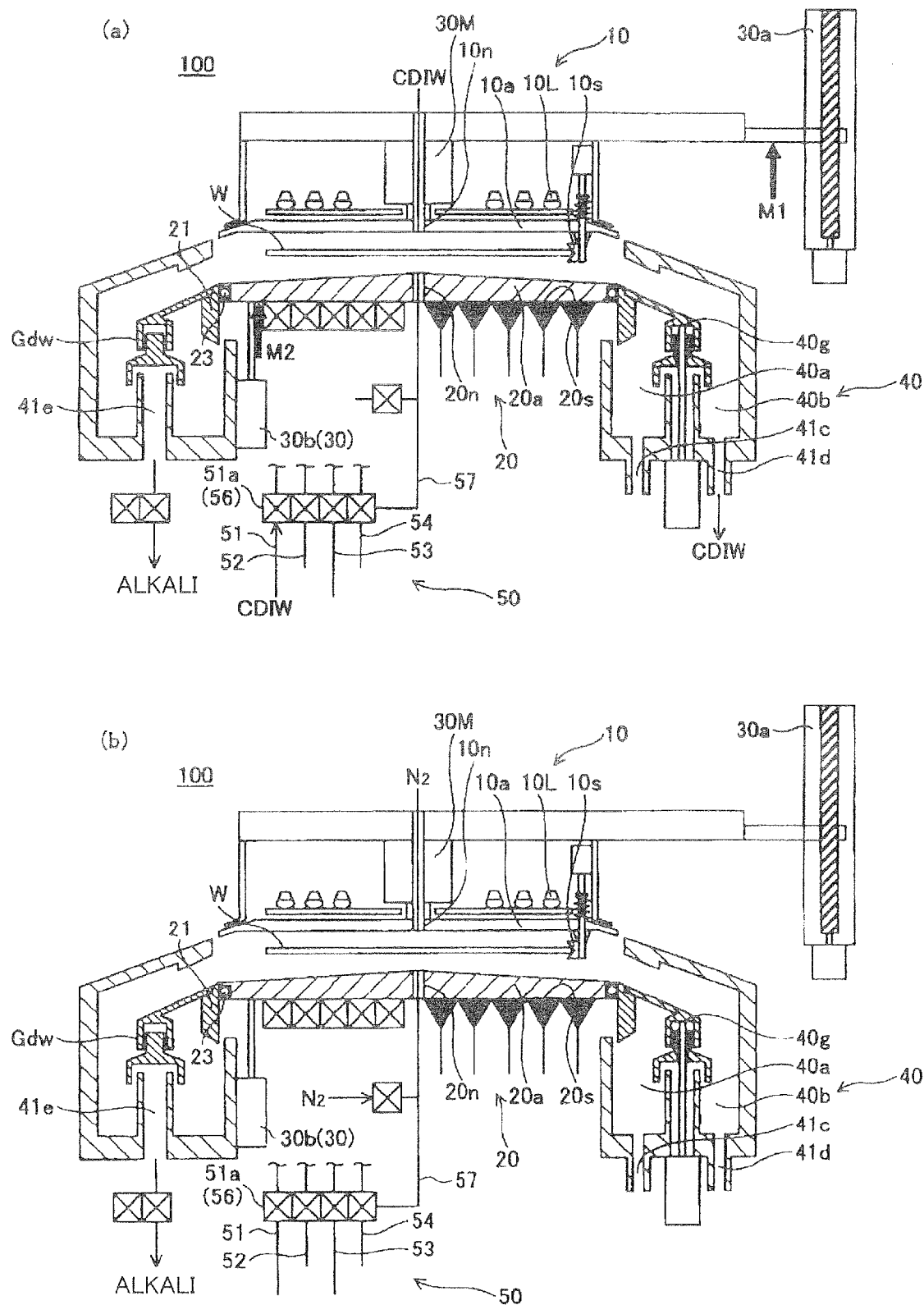
FIG. 9 is an explanatory view for explaining a process by CDIW and a drying process performed in this embodiment.

The supply pipe 57 is connected to the base plate nozzle 20n through a flow rate controller and a supply valve, not shown. In addition, the supply pipe 57 is connected to a drain pipe, not shown. The drain pipe has an opening and closing valve. Further, connected to the supply pipe 57 is a pipe for supplying a nitrogen gas, which is an inert gas to be used in a below-described drying step (FIG. 9(b)), through an opening and closing valve.

On the other hand, from the plurality of ejection openings 20m (FIG. 4(b))) which are helically arranged from the central portion of the base plate member 20a, a hydrogen peroxide solution is ejected as a process liquid to be used in a below-described process by SPM (FIG. 4(a)), through an opening and closing valve. In addition, from the top plate nozzle 10n of the substrate support unit 10, a liquid (and nitrogen gas) is supplied. Since structures of the pipes and the valves are the same as those of the base plate nozzle 20n, description thereof is omitted.

As shown in FIG. 1, the substrate processing apparatus 100 further includes a controller 200 configured to totally control an operation of the substrate processing apparatus 100 as a whole. The controller 200 is configured to control operations of all the functional components of the substrate processing apparatus 100 (e.g., the substrate support unit 10, the driving unit 30, the collective valve 56, ultrasonic vibration elements $20_{S1}$ to $20_{S5}$ and so on). The controller 200 can be realized by, for example, a multipurpose computer as a hardware, and a program for executing the computer (apparatus control program and process recites, etc.) as a software. The software is stored in a storage medium such as a hard disc drive that is fixedly disposed on the computer, or is stored in a storage medium such as a CD-ROM, a DVD or a flash memory that is removably set in the computer. Such a storage medium is indicated by the reference number 201 in FIG. 1. A processor 202 invokes and executes a predetermined process recipe from the storage medium 201, based on an instruction from a not-shown user interface according to need, whereby the respective functional components of the substrate processing apparatus 100 are operated to perform a predetermined process under the control of the controller 200.

(Substrate Processing Operation)

Figure 2:
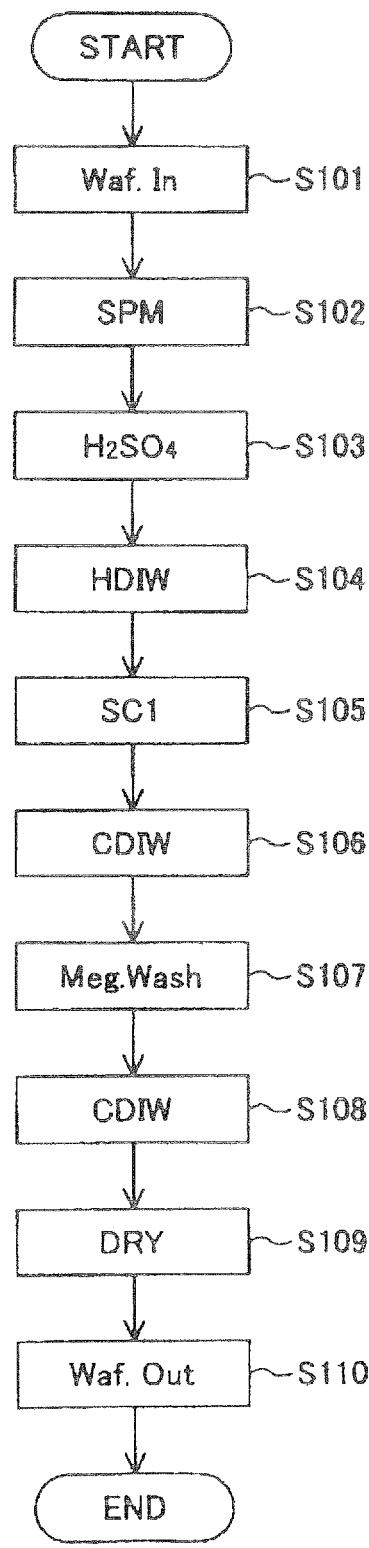
FIG. 2 is a flowchart for explaining a substrate processing method in this embodiment.

Next, an example of a substrate processing method performed in the aforementioned substrate processing apparatus 100 is described, with reference to FIGS. 2 to 9. FIG. 2 is a flowchart for explaining the substrate processing method in this embodiment. FIGS. 3 to 9 are explanatory views for explaining respective steps of the substrate processing operation to be performed. The respective steps of FIGS. 3 to 9 are described with reference to FIG. 2.

At first, in a step S101 of FIG. 2 (and FIG. 3), a wafer W is loaded into the substrate processing apparatus 100 by a transfer mechanism 61 (FIG. 3), and the wafer W is located below the substrate support unit 10. The wafer W is delivered from the transfer mechanism 61 to the substrate support unit 10 by a delivery mechanism, not shown. The wafer W is supported by the claw unit 10s (spin chuck). In this embodiment, the wafer W is supported, with a front surface (patterned surface) thereof facing downward. Thereafter, the program proceeds to a step S102. The wafer W may be supported, with its patterned surface facing upward.

In the step S102 of FIG. 2 (and FIG. 4), the substrate processing apparatus 100 performs a process in which a resist formed on the front surface of the wafer W is peeled.

Figure 4:
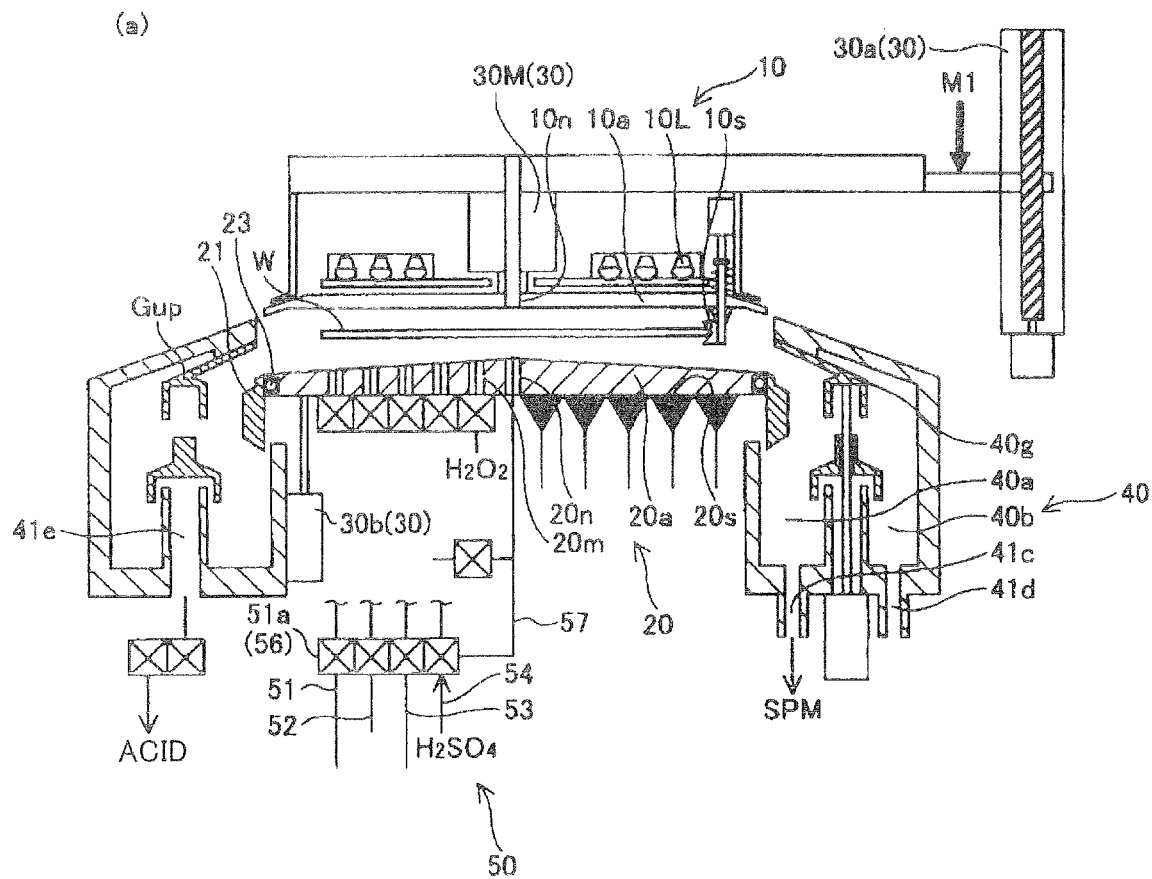
FIG. 4 is an explanatory view for explaining a process by SPM performed in this embodiment.
Figure 4:
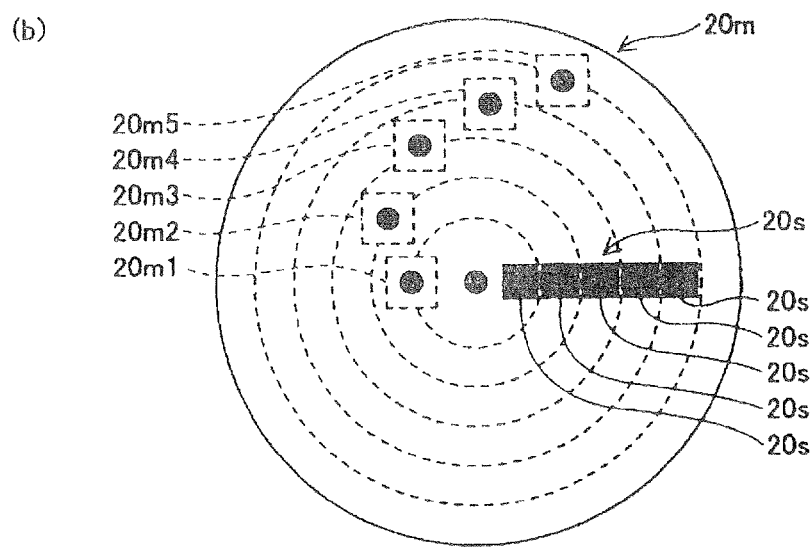
Figure 5:
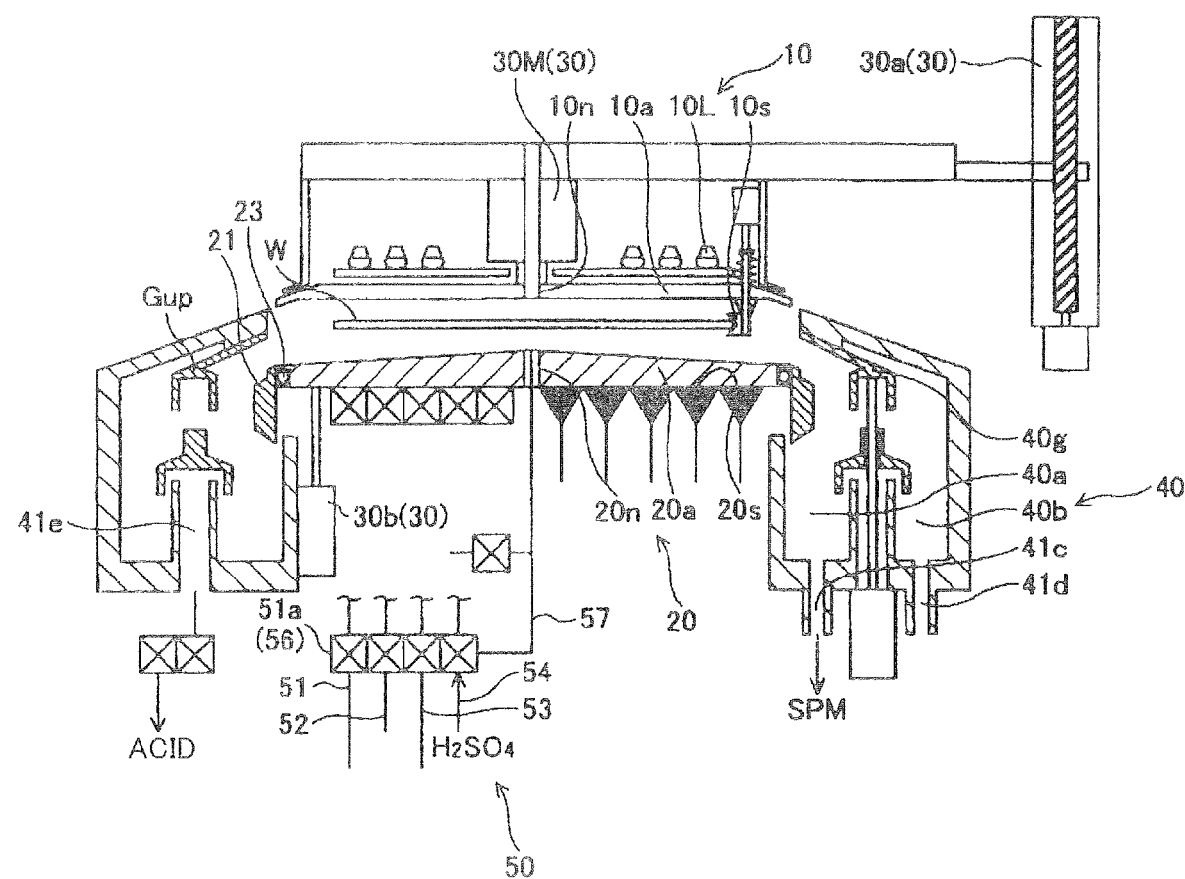
FIG. 5 is an explanatory view for explaining a process by $H_2SO_4$ performed in this embodiment.
Figure 6:
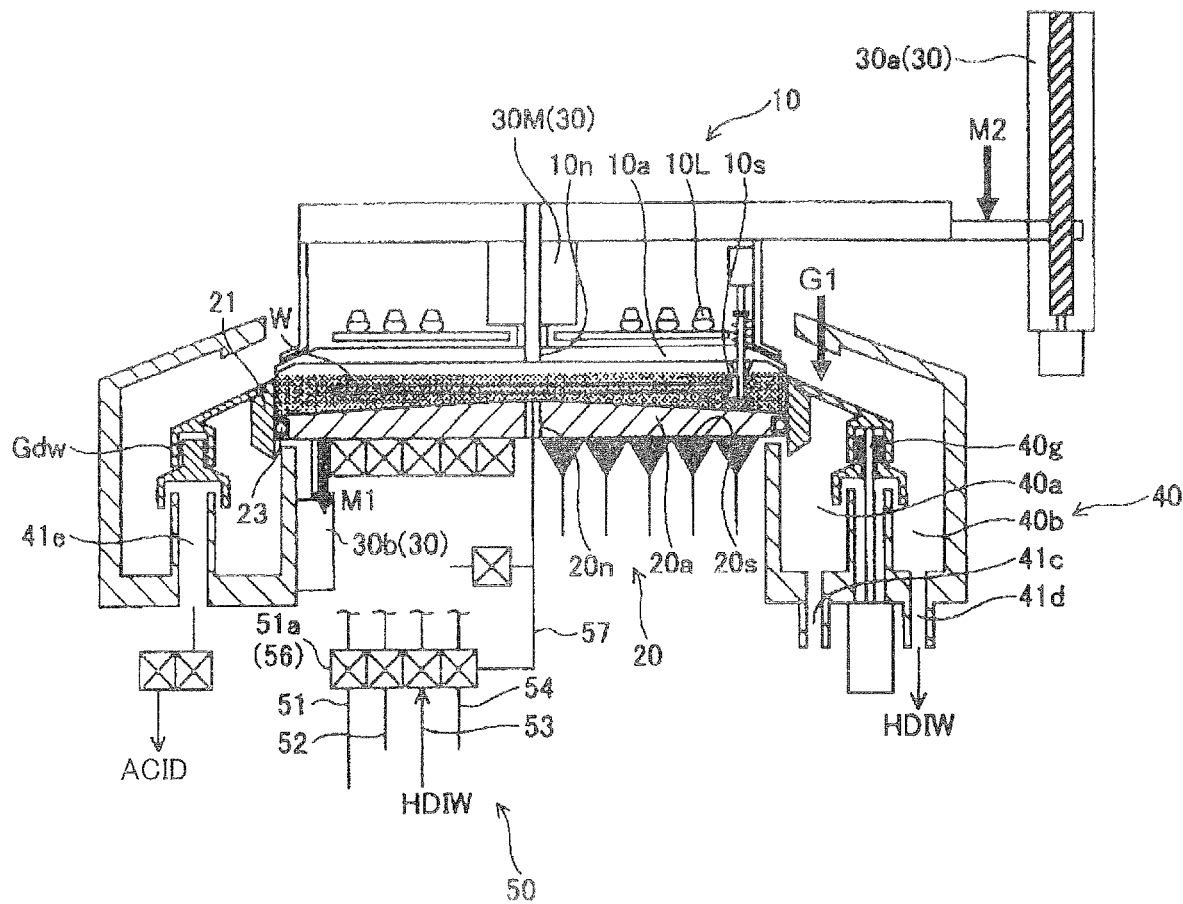
FIG. 6 is an explanatory view for explaining a process by HDIW performed in this embodiment.

Specifically, in FIG. 4(*a*), the substrate processing apparatus 100 firstly moves downward the substrate support unit 10 (M1) by the plate driving unit 30*a* of the driving unit 30. Then, the wafer W (top plate member 10*a*) is rotated at a predetermined rotating speed (e.g., 500 rpm) by the motor 30M of the driving unit 30. At this time, the partition guide 40*g* is located in the upper guide position Gup.

Then, the three-way valve of the pipe 54 is opened to eject sulfuric acid ($H_2SO_4$) onto the front surface of the wafer W from the base plate nozzle 20*n*. Simultaneously, a hydrogen peroxide solution ($H_2O_2$) is ejected onto the front surface of the wafer W from the ejection openings 20*m*. At this time, a mixed liquid of the sulfuric acid the hydrogen peroxide solution is generated on the front surface of the wafer W. In the mixed liquid, a chemical reaction between the sulfuric acid and the hydrogen peroxide solution ($H_2SO_4 + H_2O_2 \rightarrow H_2SO_5 + H_2O$) occurs, so that SPM containing highly oxidative $H_2SO_5$ is generated.

The SPM on the front surface of the wafer W is subjected to the centrifugal force caused by the rotation of the wafer W, so that the SPM expands on the front surface of the wafer W from a central portion of the front surface toward an outer peripheral edge thereof. At this time, the SPM forms an SPM liquid membrane on the front surface of the wafer W. Thus, an unwanted resist remaining on the front surface of the wafer W can be peeled by the oxidative reaction of SPM.

A temperature of the SPM on the front surface of the wafer W lowers toward the outer periphery of the wafer W. Thus, the substrate processing apparatus 100 heats the wafer W or the SPM by the heating unit 10L so as to control the temperature of the liquid on the front surface of the wafer W to be uniformly maintained. Further, the SPM liquid membrane on the front surface of the wafer W scatters from the outer peripheral edge of the wafer W by the centrifugal force, and the scattering SPM is received in the first liquid accommodation unit 40*a* of the cup unit 40 and is drained through the drain opening 41*c*.

FIG. 4(*b*) is a plan view showing the positions of the ejection openings 20*m* for ejecting a hydrogen peroxide solution. In this embodiment, there are provided the five ejection openings (20*m*$_1$ to 20*m*$_5$). The ejection openings (20*m*$_1$ to 20*m*$_5$) may be helically located from the central portion of the circular surface of the base plate member 20*a*. A flow rate of the hydrogen peroxide solution to be ejected from each ejection opening 20*m* can be controlled by an opening and closing valve, not shown.

In this manner, when the substrate processing step for peeling the resist formed on the front surface of the wafer W has been completed, the program proceeds to a step S103.

In the step S103 of FIG. 2 (and FIG. 5), the substrate processing apparatus 100 performs, as a post resist-peeling process, a process in which sulfuric acid is ejected onto the front surface of the wafer W from the base plate nozzle 20*n*, while the wafer W is still being rotated. In this case, no hydrogen peroxide solution is ejected from the ejection openings 20*m*. Since the other conditions are the same as those in the step S102, description thereof is omitted. The substrate processing apparatus 100 replaces the SPM liquid membrane, which was formed in the step S102 on the front surface of the wafer W, with a sulfuric-acid liquid membrane.

In this manner, when the replacement has been completed, the rotation of the wafer W is stopped, and the program proceeds to a step S104.

In the step S104 of FIG. 2 (and FIG. 6), the substrate processing apparatus 100 performs a process in which the wafer W is immersed into HDIW (hereinafter referred to as DIP process).

To be specific, the substrate processing apparatus 100 firstly makes higher the upper end position of the storage-member floodgate unit 21 than the upper end position of the base plate member 20*a* (M1), so as to form the storage tank capable of storing a liquid. Then, by opening the three-way valve of the pipe 53, HDIW is supplied from the base plate nozzle 20*n* so that the HDIW is stored in the storage tank. Further, the substrate processing apparatus 100 moves the partition guide 40*g* to the lower guide position Gdw (G1).

Then, the substrate processing apparatus 100 moves downward the substrate support unit 10 (M2) by the plate driving unit 30*a*, so as to immerse the wafer W into the HDIW stored in the storage tank. The DIP process is then performed for a predetermined period of time. In the DIP process, cleaning (overflow cleaning) is performed while HDIW is successively supplied and the liquid is drained through the drain opening 41*d*. Due to the DIP process, the peeled resist and/or the sulfuric acid remaining on the front surface of the wafer W can be removed, whereby the wafer W can be uniformly cleaned. In addition, it is possible to simultaneously clean the base plate member 20*a* and so on to which the process liquid (such as SPM), which was used in the steps S102 and S103, adheres. During the DIP process, the substrate processing apparatus 100 may rotate the wafer W (top plate member 10*a*) by the motor 30M at a low rotating speed.

In this manner, when the DIP process has been completed, the program proceeds to a step S105.

Figure 7:
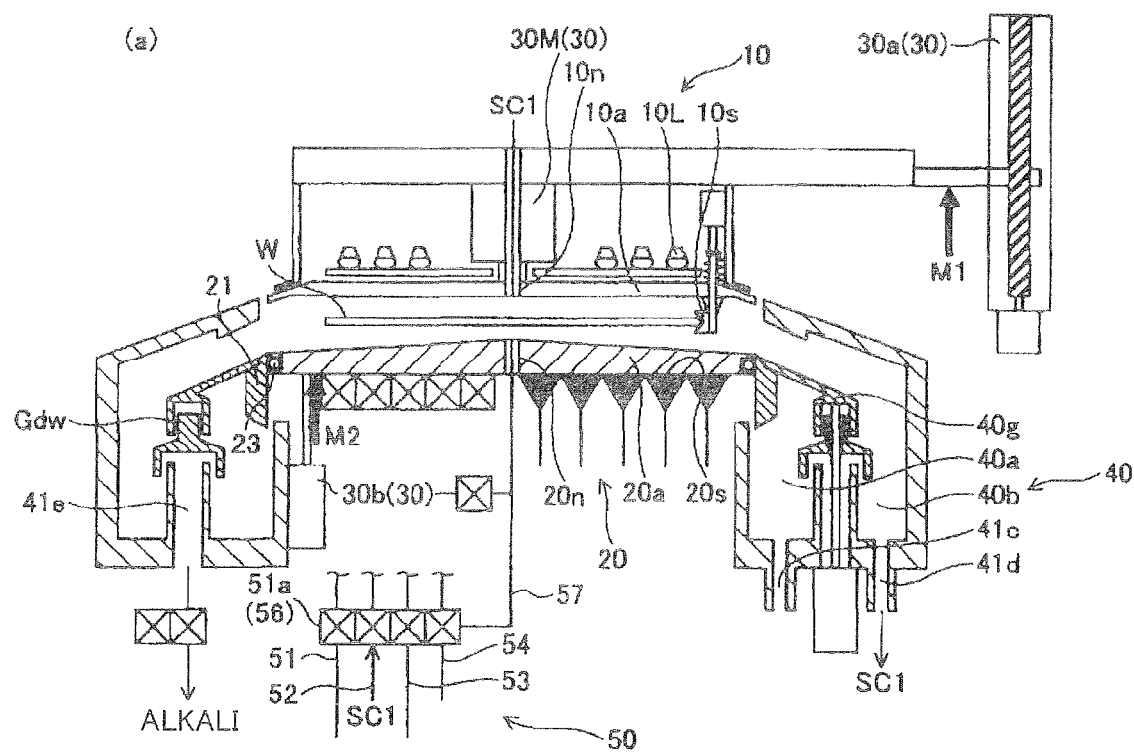
FIG. 7 is an explanatory view for explaining a process by SC1 and CDIW performed in this embodiment.
Figure 7:
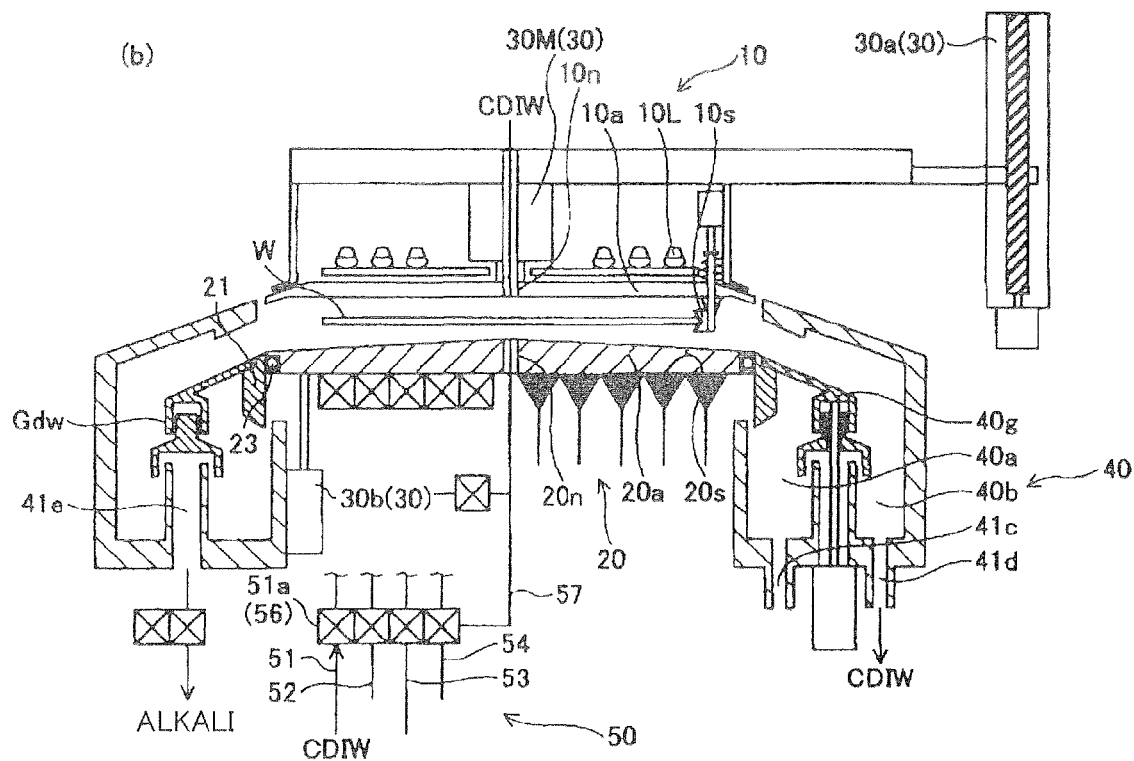
Figure 8:
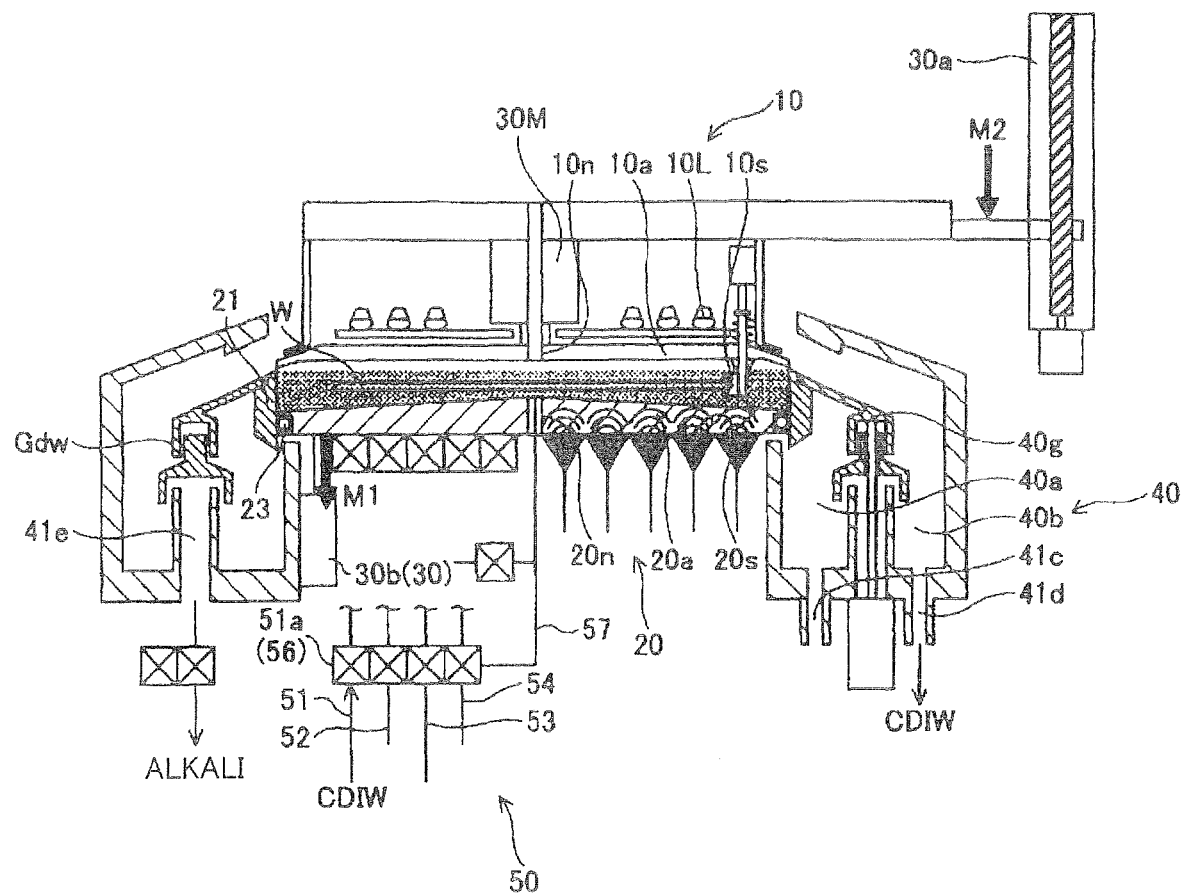
FIG. 8 is an explanatory view for explaining an ultrasonic cleaning process performed in this embodiment.

In the step S105 of FIG. 2 (and FIG. 7(*a*)), the substrate processing apparatus 10 performs a process in which the wafer W is cleaned by SC1, while rotating the wafer W (rotation cleaning).

To be specific, the substrate processing apparatus 100 firstly moves upward the substrate support unit 10 (M1) by the plate driving unit 30a, so as to pull out and separate the wafer W from the HDIW in the storage tank. In addition, the substrate processing apparatus 100 makes higher the upper end position of the base plate member 20a than the upper end position of the storage-member floodgate unit 21 (M2) by the base plate driving unit 30b, so as to drain the HDIW used in the step S104 through the drain opening 41c of the first liquid accommodation unit 41a. At this time, the drainage of the HDIW that was used in the DIP process in the step S104 and preparation of the below-described rotation cleaning can be simultaneously performed.

Then, the substrate processing apparatus 100 rotates the wafer W (top plate member 10a) at a predetermined rotating speed (e.g., 1000 rpm) by the motor 30M. SC1 is ejected onto the front and rear surfaces of the rotating wafer W from the top plate nozzle 10n and the base plate nozzle 20n. At this time, the SC1 ejected onto the front and rear surfaces of the wafer W is subjected to the centrifugal force caused by the rotation of the wafer W, so as to form a liquid membrane on the front and rear surfaces of the wafer W. Thus, particles adhering to the front and rear surfaces of the wafer W can be removed. In addition, the SC1 liquid membrane on the front and rear surfaces of the wafer W scatters from the outer peripheral edge of the wafer W by the centrifugal force, and the scattering SC1 is received in the second liquid accommodation unit 40b of the cup unit 40 and is drained through the drain opening 41d.

In this manner, when the rotation cleaning of the wafer W has been completed, the program proceeds to a step S106.

In the step S106 of FIG. 2 (and FIG. 7(b)), the substrate processing apparatus 100 performs, as a post process of the rotation-cleaning by SC1, a process in which the SC1 on the front and rear surfaces of the wafer W is removed by ejecting CDIW onto the front and rear surfaces of the wafer W. Since process contents are the same as those of the step S105, description thereof is omitted. After the substrate processing apparatus 100 has completed the removal of SC1, the program proceeds to a step S107.

In the step S107 of FIG. 2 (and FIG. 8), the substrate processing apparatus 100 gives vibrations to the wafer W by the ultrasonic vibration plate 20s so as to ultrasonically clean the wafer W.

To be specific, in the same manner as that of step S104, the substrate processing apparatus 100 firstly forms the storage tank such that CDIW is stored in the storage tank (M1). In addition, the substrate processing apparatus 100 rotates the wafer W (top plate member 10a) at a low speed by the motor 30M. Then, the substrate processing apparatus 100 moves downward the substrate support unit 10 (M2) by the plate driving unit 30a, so as to immerse the wafer W into the CDIW stored in the storage tank. At this time, the substrate processing apparatus 100 gives vibrations to the wafer W and so on by the ultrasonic vibration plate 20s for a predetermined period of time, so as to physically clean the wafer W. In this embodiment, cleaning (overflow cleaning) is performed while CDIW is successively supplied and the liquid is drained through the drain opening 41d. The substrate processing apparatus 100 can simultaneously clean the base plate member 20a and so on to which the process liquid (such as SC1), which was used in the step S105, adheres, whereby a cleaning step (time) in the substrate processing apparatus 100 can be reduced.

FIG. 4(b) shows the ultrasonic vibration plate 20s configured to perform an ultrasonic cleaning. In this embodiment, the ultrasonic vibration plate 20s has the five ultrasonic vibration elements ($20s_1$ to $20s_5$). The ultrasonic vibration elements ($20s_1$ to $20s_5$) may be arranged from the central portion of the circular surface of the base plate member 20a toward the outer peripheral portion thereof. In addition, outputs of the respective ultrasonic vibration elements ($20s_1$ to $20s_5$) can be individually controlled by the controller 200.

In this manner, when the ultrasonic cleaning has been completed, the program proceeds to a step S108.

In the step S108 of FIG. 2 (and FIG. 9(a)), the substrate processing apparatus 100 rinses the wafer W while rotating the wafer W.

To be specific, the substrate processing apparatus 100 firstly moves upward the substrate support unit 10 (M1) by the plate driving unit 30a so as to pull out and separate the wafer W from the CDIW in the storage tank. In addition, the substrate processing apparatus 100 makes higher the upper end position of the base plate member 20a than the upper end position of the storage-member floodgate unit 21 (M2) by the base plate driving unit 30b, so as to drain the CDIW used in the step S107 through the drain opening 41d of the first liquid accommodation unit 40b. At this time, since the drainage of the CDIW that was used in the ultrasonic cleaning process in the step S107 and a below-described rinse process can be simultaneously performed, a time required for the substrate processing apparatus 100 to drain the CDIW used in the ultrasonic cleaning can be reduced.

Then, the substrate processing apparatus 100 rotates the wafer W (top plate member 10a) at a predetermined rotating speed (e.g., 1000 rpm) by the motor 30M. CDIW is ejected onto the front and rear surfaces of the rotating wafer W from the top plate nozzle 10n and the base plate nozzle 20n. At this time, the CDIW ejected onto the front and rear surfaces of the wafer W is subjected to the centrifugal force caused by the rotation of the wafer W, so as to form a liquid membrane on the front and rear surfaces of the wafer W. Thus, the unwanted process liquids used in the previous process remaining on the front and rear surfaces of the wafer W can be cleaned and the wafer W can be rinsed. In addition, the CDIW liquid membrane on the front and rear surfaces of the wafer W scatters from the outer peripheral edge of the wafer W by the centrifugal force, and the scattering CDIW is received in the second liquid accommodation unit 40b of the cup unit and is drained through the drain opening 41d.

In this manner, when the rinse process has been completed, the program proceeds to a step S109.

In the step S109 of FIG. 2 (and FIG. 9(b)), the substrate processing apparatus 100 dries the wafer W while rotating the wafer W.

To be specific, the substrate processing apparatus 100 firstly stops the ejection of CDIW from the top plate nozzle 10n and the base plate nozzle 20n. Then, the substrate processing apparatus 100 emits an inert gas ($N_2$ gas) from the top plate nozzle 10n and the base plate nozzle 20n. Thus, the CDIW remaining on the front and rear surfaces of the wafer W is removed, and the front and rear surfaces of the wafer W can be dried.

In this manner, when the drying process has been completed, the program proceeds to a step S110.

Figure 3:
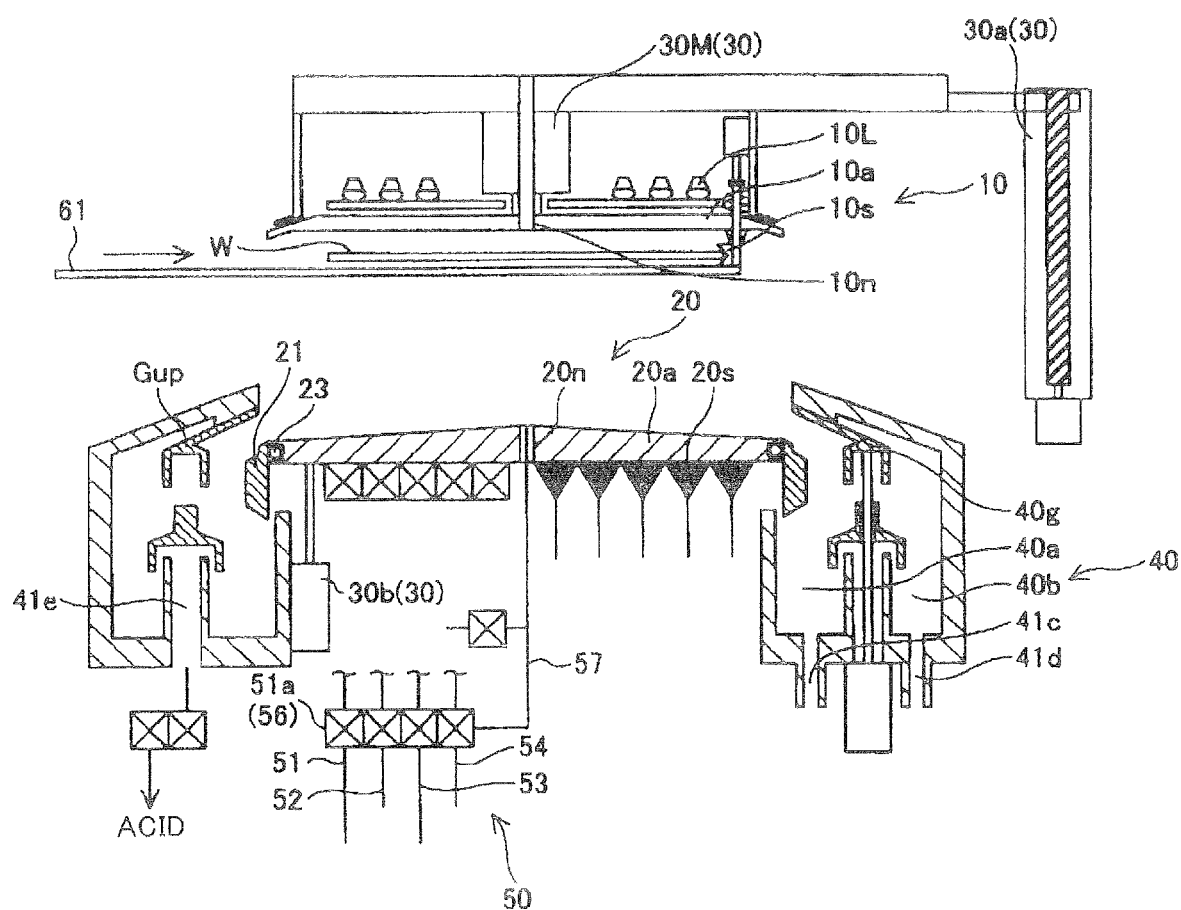
FIG. 3 is an explanatory view for explaining a wafer loading operation performed in this embodiment.

In the step S110 of FIG. 2, the processed wafer W is unloaded outside the substrate processing apparatus 100 by the transfer mechanism 61 (FIG. 3). Since the unloading method is just reverse to the procedure of the step S101, description thereof is omitted. After the unloading has been terminated, the program proceeds to the "END" in FIG. 2, so that the substrate processing operation is terminated.

Although the present invention has been described with reference to the embodiment, the present invention is not limited thereto and can be variously modified or changed in light of the attached claims.

In addition, $H_2SO_4$, SC1 and DIW are taken as examples of liquids to be used. However, not limited thereto, it is a matter of course to use a liquid adapted to a liquid process to be performed.

Although the case in which a wafer as a substrate is processed by way of example, the present invention can be used in a step of manufacturing a substrate such as a glass substrate for flat display panel, for liquid-processing the substrate.

What is claimed is:

1. A substrate processing apparatus comprising:
    a substrate support unit configured to rotatably, horizontally support a substrate;
    a storage-member bottom unit and a storage-member flood gate unit, the storage-member bottom unit being disposed below the substrate support unit, and the storage-member floodgate unit surrounding the storage-member bottom unit, the storage-member bottom unit and the storage-member floodgate unit being relatively movable in a vertical direction to take a first positional relationship and a second positional relationship, wherein in the first positional relationship, the storage-member floodgate unit projects upward from the storage-member bottom unit such that the storage-member bottom unit and the storage-member floodgate unit form a storage tank that stores a liquid on the storage-member bottom unit and inside the storage-member floodgate unit, and wherein in the second positional relationship, the storage-member floodgate unit does not project upward from the storage-member bottom unit to allow a liquid existing on the storage-member bottom unit to flow outside the storage-member bottom unit over the storage-member floodgate unit;
    a plate driving unit configured to move the substrate support unit between an immersion position at which the substrate supported by the substrate support unit is immersed into the liquid stored in the storage tank, and a separation position located above the immersion position, at which the substrate supported by the substrate support unit is separated from the liquid stored in the storage tank;
    a rotary drive unit configured to rotate the substrate supported by the substrate support unit;
    a liquid supply unit configured to supply a liquid to the substrate that is being rotated by the rotary drive unit in the separation position; and
    a cup unit disposed to surround the storage-member bottom unit and the storage-member floodgate unit and to surround the substrate that is supported by the substrate support unit, wherein the cup unit is disposed to receive a liquid having been supplied to the substrate from the liquid supply unit when the liquid supply unit supplies the liquid to the substrate and the storage-member bottom unit and the storage member floodgate unit takes the second positional relationship.

2. The substrate processing apparatus according to claim 1, wherein
    the liquid supply unit includes a base plate nozzle that is disposed on the storage-member bottom unit and is configured to supply a liquid to the storage tank or the substrate.

3. The substrate processing apparatus according to claim 1, further comprising an ultrasonic vibration plate that is disposed on the storage-member bottom unit and is configured to give vibrations to the substrate immersed in the liquid stored in the storage tank.

4. The substrate processing apparatus according to claim 1, wherein:
    the cup unit has a first liquid accommodation unit, a second liquid accommodation unit disposed outside the first liquid accommodation unit, and a movable partition guide partitioning the first liquid accommodation unit and the second liquid accommodation unit; and
    when the storage-member bottom unit and the storage-member floodgate unit take the second positional relationship and the partition guide is located in an upper guide position, the liquid is drained through the first liquid accommodation unit, and when the storage-member bottom unit and the storage-member floodgate unit take the second positional relationship and the partition guide is located in a lower guide position, the liquid is drained through the second liquid accommodation unit.

5. The substrate processing apparatus according to claim 1, wherein
    the substrate support unit has an annular-shaped top plate member disposed above the substrate that is supported by the substrate support unit.

6. The substrate processing apparatus according to claim 1, further comprising a heating unit that is disposed on the substrate support unit and is configured to heat the substrate or the liquid on the substrate.

* * * * *